United States Patent [19]

Wampler

[11] 4,394,617
[45] Jul. 19, 1983

[54] SWEPT-DIP PROBE

[76] Inventor: E. Lawrence Wampler, 6708 Bostwick Dr., Springfield, Fairfax County, Va. 22151

[21] Appl. No.: 298,657

[22] Filed: Nov. 18, 1981

[51] Int. Cl.³ .......................................... G01R 27/00
[52] U.S. Cl. .................. 324/57 Q; 324/81; 324/149; 331/64
[58] Field of Search ............ 324/57 Q, 81, 149; 331/64; 334/64, 86

[56] References Cited

U.S. PATENT DOCUMENTS

| 2,721,908 | 10/1955 | Moe | 324/149 X |
| 2,736,807 | 2/1956 | Porter | 324/81 X |
| 3,283,242 | 11/1966 | Oliver | 324/149 X |

OTHER PUBLICATIONS

Queen, Transistorizing the Dip Meter, Radio-Electronics, May 1956, pp. 34, 35.

Primary Examiner—Stanley T. Krawczewicz

[57] ABSTRACT

The present invention relates to the design and fabrication of a probe, ancillary signal conditioning circuits with display circuits and related equipment required to measure the resonate frequency and display the shape of the resonance curve. The probe uses the energy absorbing method of indicating these parameters. A graphical display or an analog meter dip indicates the resonant frequency. A digital frequency meter can measures the frequency points precisely.

6 Claims, 2 Drawing Figures

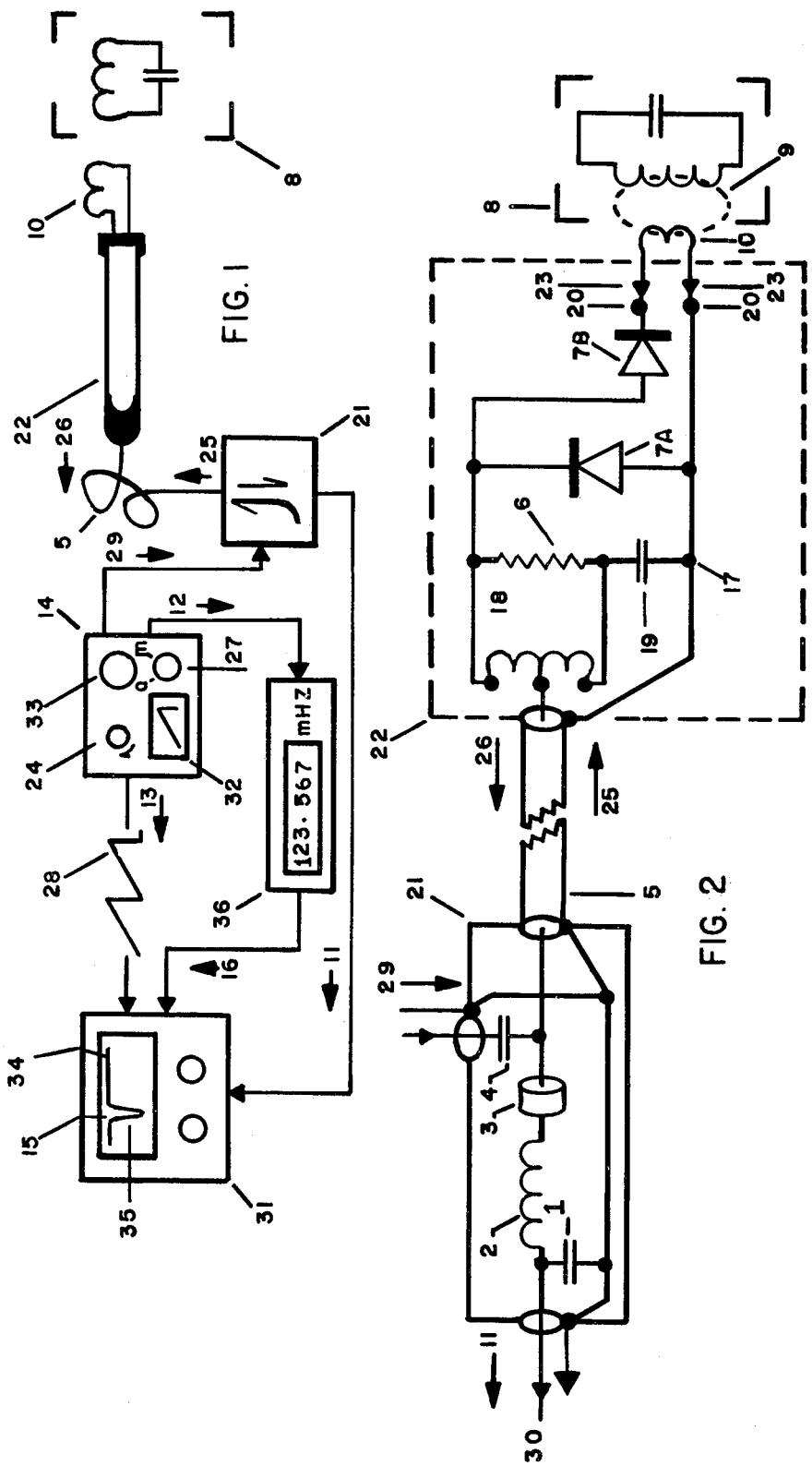

SWEPT-DIP PROBE

REFERENCE

Probe for Grid Dip Meter; U.S. Pat. No. 2,736,807.

BACKGROUND OF THE INVENTION

1. Field of the Invention

The present invention is related to the field of electrical measurement and network tests, and specifically to the measurement of the resonant frequency of a tuned network and it is also related to the measurement of the "Q" factor of the electrical network.

2. Description of the Prior Art

There is a need to know the resonate frequency of a tuned circuit during adjustment. The prior art used a manually tuned oscillator with an inductor, being suitably exposed and part of the oscillator tuning circuit, coupled directly to the network-under-test by inductive mutual coupling. It is known as a dip meter and as a grid dipper. The oscillator is contained in the tuning head with a calibrated frequency scale. The device of this disclosure is identified as a swept-dip-probe and will display graphically the circuit response. The prior art dip meter device uses an analog meter to indicate resonance. Operation of the dip meter requires a display sensitive to level changes in the r.f. energy absorbed by the network-under-test. The oscillator supplying the r.f. energy is manually tuned over the frequency range of interest. The dip probe uses an r.f. signal generator that is stable and it is automatically swept over the frequency range of interest. The dip probe resonance measurement covers many octaves of the r.f. spectrum in one frequency sweep and displays the response curve of the network-under-test plotted in a graphical form. The dip member uses an integral r.f. source and is subjected to frequency changes due to the degree of coupling. The dip probe r.f. energy oscillator is well isolated from the coupling inductance so that its stability is only slightly affected by the degree of coupling to the network-under-test.

The prior art used indirect voltages and currents as a measurement parameter. They are displayed on analog meter movements. The grid dipper measures grid bias of an vacuum tube oscillator, which is a direct indication of the r.f. voltage level in the oscillator tank circuit. Mutual coupling to a network-under-test reduces the oscillator tank r.f. voltage, dependent on the degree of mutual coupling, and the difference between the r.f. energy frequency and the resonant frequency of the network-under-test. Absorption of the r.f. energy from the oscillator reduces the bias, and the emitter and the collector currents in the solid state oscillator. They are used as indirect resonance indicating parameters.

SUMMARY OF THE INVENTION

The object of this disclosure is to provide a handheld dip probe suitable for measuring the r.f. resonant frequency of a circuit remote from the probe energy source and to use a graphical data display. The dip probe is broadband but is limited by self-resonance in the detachable links. And, another limit is the available mutual inductance between the link and the network-under-test.

A second objective of this disclosure provide a resonance point measuring probe using a wideband swept frequency techniques and to show the circuit response graphically on a suitable display. This display may be an oscilloscope or any x,y plotting device. Furthermore, another object of this disclosure is the display of the frequency points along the response curve verses frequency with each frequency point measured by and displayed on a digital frequency meter and the graphical display.

BRIEF DESCRIPTION OF THE DRAWINGS

The swept dip probe block diagram and display curve is shown in FIG. 1. A probe is coupled to the network-under-test by the inductor (links) and the probe analog signal is carried by a coaxial line to the radio frequency-analog signal combiner/separator. The combiner/separator filters the probe analog signal and it is used to drive one axis of the display. The other input to the combiner/separator is the r.f. signal source, which can be both manually and automatically frequency swept as needed. The analog signal waveform is displayed with a dip to indicate the resonance frequency.

FIG. 2 is the component circuit arrangement of the probe, showing the matching transformer and the probe analog signal processing. The various signal paths are further defined in this figure.

DESCRIPTION OF THE PREFERRED EMBODIMENT

The swept dip probe uses inductive mutual coupling 9 between the probe coupling link 10 and a resonant radio frequency circuit 8, an inductor and capacitor, and any circuit capable of resonance and mutual coupling, including electro-magnetic transmission lines and waveguides. Inductive mutual coupling 9 and direct mechanical connections to the network-under-test 8 are desired modes of use. It is necessary to couple r.f. energy 25 to link 10 and this is accomplished by diode 7A, which also rectifies the r.f. energy. Rectified energy from diode 7A is opposed by rectified r.f. energy from diode 7B. The net rectified value is the probe analog signal 26.

R.F. energy generator 33, in source block 14, is controlled by 27 and the analog waveform source 32. The analog waveform 28 drives the graphic display 31. R.F. energy from 33 is r.f. input to the combiner/separator 21 that is sent to the dip probe 22. The sweep waveform 32 may be disabled, and the value manually set to any level necessary for r.f. energy output with constant r.f. signal frequency from source 33 as needed for the evaluation of circuit parameters such as the circuit figure of merit "Q". The common circuit is defined by reference number 17.

Signal flow reference nos. are: (11) probe analog waveform to display, (12) r.f. energy to frequency counter, (13) sweep waveform to display, (16) r.f. frequency count to the display 31 from counter 36. Frequency point 15 is marked by the counter 36.

The display 31 curve baseline 34 has a slight offset caused by lack of perfect diodes and a voltage drop caused by r.f. current through link 10 and in the operational limit by self-resonance in link 10. Its usefulness is not limited by these factors, and the self-resonance phenomenon is used to display the same property in circuit components.

The swept-dip-probe is based on inductive mutual coupling 9 producing a small mutual impedance in link 10. Under this condition, diode 7A rectification is slightly less than that from diode 7B. The magnitude of the resultant analog voltage 26, as displayed by 31, as curve 35, is greater than when no mutual coupling 9 to link 10 exists. The displayed curve 35 is a direct result of r.f. energy absorption by the network-under-test.

A larger analog voltage 26 is developed as the r.f. oscillator 33 frequency approaches the resonant frequency of circuit 8. As this happens, a dip in curve 31 shows the larger absorption point in the response curve 35. R.F. energy 29 and probe analog waveform voltage 26 combiner/separator 21 allows a single coaxial line 5 to carry both signals. The probe analog waveform 26 is rectified R.F. energy sent to the probe 22. It is returned to the combiner/separator 21 for further processing within the combiner/separator 21. The probe analog signal is separated from the r.f. energy by a lowpass filter, formed by capacitor 1 and in conjunction with inductor 2 and is then displayed as waveform 31 on the display. The lowpass filter must not absorb the r.f. energy and pass with little attenuation, the probe analog waveform to the display 31.

The r.f. impedance of the diodes 7A,B is high and dependent on the level of the r.f. energy 25. This required a practical impedance match to the coaxial transmission line 5 impedance. Low levels of r.f. energy produce diode r.f. impedance levels that are up to 5 times greater than that of the transmission line 5 impedance. Transformer 18 is used to match the diode 7A,B network to the transmission line 5. The probe requires a transformer 18 having a bandwidth of one octave greater than the full frequency range of all coupling probe links 10.

Transformer 18 is a transmission line and conventional transformer with a low turns ratio and wideband characteristics. The transmission line 5 has a useful impedance range of 50 to 100 ohms. Therefore, a transformer with a 4 to 1 impedance transformation ratio is satisfactory. Resistor 6 further matches the impedance of diode network 7A,B, when the diode network impedance is greater than the transformed impedance of the transmission line. This limits the VSWR of the probe assembly 22 to a value closer to 1 to 1.0 over a broad frequency range and hence, reduces baseline distortion 34. Transformer impedance matching adds a useful feature to the swept-dip-probe as the increased probe analog voltage developed by the rectification action of the diode network 7A,B. The increased probe analog voltage output is approximately equal to the transformer turns ratio.

Capacitor 19, at the transformer bottom terminal, is a low impedance r.f. energy bypass at the lowest frequency of r.f. energy the probe is to use. The time constants formed by capacitor 1,4 and 19 and diode analog impedance combined with the circuit resistance must pass the analog waveform 35, without distortion. Time constants less than 0.01 seconds will pass, without distortion, all risetimes of the waveform 26. There is no conflict, as normally the highest frequency of waveform 35 is 100 times less than the lowest usable r.f. frequency of the probe assembly 22.

The r.f. energy and analog signal combiner/separator 21 function is to allow use of one coaxial line 5 to carry the r.f. energy 25 to probe 22 and the analog voltage 26 from probe 22 to the combiner/separator 21, and then to the display 31. The combiner/separator 21 also provides the interface between the r.f. energy source 33, the display device 31 and the probe assembly 22. Capacitor 4 passes the input r.f. energy 25 to transmission line 5 and prevents the analog voltage 26 from being shorted to the input of the r.f. energy surface 33. Connection between the combiner/separator 21 and the r.f. energy source 33 is a coaxial line 29. Inductor 2 forms a radio frequency choke, in conjunction with ferro-magnetic bead 3, and prevents the e.f. energy 25 from entering the display path 30. Capacitor 1 removes r.f. energy coupled to the display path 30 by stray capacitance between the r.f. path and the display path 30.

Link 10 electrical and mechanical connections to the probe assembly are connector pins 23 and 20. A band of frequencies is covered by a link 10 having a specified number of turns. Self-resonance limits the coverage of each link and the link form factor limits the number of turns each link can have. Therefore, several links are used to cover the full frequency range of the system. But, each links must have sufficient diameter to provide proper coupling to the network-under-test. This controls the sensitivity level needed for convenient display of the resonance curve.

I claim:

1. A probe comprising a detachable coupling link acting as a primary winding of a transformer, a secondary is formed by the network-under-test coupling inductance; one terminal of the primary is series connected to a diode, the second terminal of the primary winding is connected to the outer conductor of a coaxial transmission line; the second terminal of the diode is connected to the center conductor of the coaxial transmission line; the purpose of the diode is to couple rectified r.f. energy to the primary winding of the transformer and to rectify the r.f. energy for measurement of the circuit resonance parameter; the coaxial transmission line center conductor and the first diode junction are connected to a second diode; the second diode, rectifies the r.f. energy in phase opposition to the first diode, the opposite terminal of the second diode is connected to the outer conductor of the coaxial transmission line; an analog signal that is a net result of the rectification by the two diodes is carried by the transmission line to the r.f. energy-analog signal combiner/separator; the input to the combiner/separator is the r.f. energy source and the output is the analog signal representation of the resonance response curve that is a frequency function of the network-under-test; the analog signal is displayed by a suitable display device with radio frequency on one axis, driven by the frequency sweep analog waveform and on the other axis is the network response function driven by the probe analog waveform, a result of probe coupling to the network-under-test; and, including a r.f. frequency-analog signal combiner/separator for processing the signals and comprised of an r.f. input connection, a r.f. signal output, coupled to the probe coaxial cable center conductor through a d.c. blocking capacitor; the coaxial cable center conductor is also connected to an r.f. choke first end, and the r.f. choke second end is connected to the display device, the display device end of the r.f. choke, the second end, is connected to a r.f. bypass capacitor; the opposite end of the r.f. bypass capacitor is connected to the common circuit point of the system, thus forming a lowpass filter.

2. A probe as recited in claim 1, except an auto-transformer is connected between the two diodes and the center conductor of the transmission line, to form an impedance match between the diode network and the transmission line, the auto-transformer tap terminal is connected to the center conductor of the coaxial transmission line, the top auto-transformer terminal is connected to the junction point of the two diodes, and the bottom auto-transformer terminal is connected to the coaxial transmission line outer conductor through a d.c. blocking capacitor; a resistor is connected across the the two outer terminals of the auto-transformer for the purpose of trimming the relatively high diode/link circuit r.f. impedance to that required to match the transmission line; the auto-transformer is used to step-down the relatively high diode impedance to the transmission line.

3. A probe as recited in claim 1, including a digital frequency meter to measure precisly the frequency points along the response curve in a very slow sweep and with manually swept frequency; and an analog meter, digital and electro-mechanical, used to indicate the network-under-test resonant frequency point.

4. A probe as recited in claim 2 including a matching transformer of conventional design.

5. A probe as recited in claim 2 including a matching transformer of the transmission-line transformer type of design.

6. A probe as recited in claim 1 with a sweep waveform including a pause of selectable time duration and curve point location; the pause time duration used to mark the display and to permit the digital frequency counter to perform a frequency measurement.

* * * * *